US010290676B2

United States Patent
Pesetski et al.

(10) Patent No.: US 10,290,676 B2
(45) Date of Patent: May 14, 2019

(54) SUPERCONDUCTING DEVICE WITH THERMALLY CONDUCTIVE HEAT SINK

(71) Applicants: Aaron A. Pesetski, Gambrills, MD (US); Patrick Alan Loney, Fairview Park, OH (US)

(72) Inventors: Aaron A. Pesetski, Gambrills, MD (US); Patrick Alan Loney, Fairview Park, OH (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/677,756

(22) Filed: Aug. 15, 2017

(65) Prior Publication Data

US 2019/0058005 A1    Feb. 21, 2019

(51) Int. Cl.
| | | |
|---|---|---|
| *H01L 39/22* | (2006.01) | |
| *H01L 27/18* | (2006.01) | |
| *H01L 23/367* | (2006.01) | |
| *H01L 23/66* | (2006.01) | |
| *H01L 39/04* | (2006.01) | |

(52) U.S. Cl.
CPC ............ *H01L 27/18* (2013.01); *H01L 23/367* (2013.01); *H01L 23/66* (2013.01); *H01L 39/045* (2013.01); *H01L 2223/6683* (2013.01)

(58) Field of Classification Search
CPC ..... H01L 27/18; H01L 39/025; H01L 39/045; H01L 39/22; H01L 39/223; H01L 23/53285; H01L 23/34; H01L 23/345; H01L 23/367; H01L 23/3672; H01L 29/437; H01L 2924/1423; H01L 2223/6683
See application file for complete search history.

(56) References Cited

U.S. PATENT DOCUMENTS

| | | |
|---|---|---|
| 4,554,567 A | 11/1985 | Jillie et al. |
| 7,382,138 B1 * | 6/2008 | Umans ............... G01R 31/34 |
| | | 324/545 |
| 2005/0254215 A1 | 11/2005 | Khbeis et al. |
| 2009/0102580 A1 | 4/2009 | Uchaykin |
| 2011/0089405 A1 * | 4/2011 | Ladizinsky ............ B82Y 10/00 |
| | | 257/31 |

(Continued)

FOREIGN PATENT DOCUMENTS

| | | |
|---|---|---|
| EP | 0883178 A2 | 12/1998 |
| WO | 2011109595 | 9/2011 |

OTHER PUBLICATIONS

International Search Report corresponding to PCT/US2018/050921, dated Dec. 7, 2018.

(Continued)

*Primary Examiner* — David C Spalla
(74) *Attorney, Agent, or Firm* — Tarolli, Sundheim, Covell & Tummino LLP

(57) ABSTRACT

An integrated circuit is provided that comprises a resistor, a first superconducting structure coupled to a first end of the resistor, and a second superconducting structure coupled to a second end of the resistor. A thermally conductive heat sink structure is coupled to the second end of the resistor for moving hot electrons from the resistor prior to the electrons generating phonons.

19 Claims, 4 Drawing Sheets

(56) References Cited

U.S. PATENT DOCUMENTS

2015/0119253 A1* 4/2015 Yohannes ............ H01L 39/223
                                                                            505/190

OTHER PUBLICATIONS

Wellstood, F.C. et al. "Hot Electron Effect in the dc Squid," Department of Phsyics, University of California: Materials and Chemical Sciences Division, Lawrence Berkeley Laboratory. IEEE Transactions on Magnetics, vol. 25, No. 2, Mar. 1989. Abstract section titled "Indtroduction"; p. 1001 left column, last paragraph—right column, 1st paragraph; p. 1001 last paragraph of section titled "Heating in Normal metal thin-films"; p. 1003 section entitled "Results of squids"; p. 1003-p. 1004 figure 3c.

Ramos, et al. "Design for Effective Thermalization of Junctions for Quantum Coherence" IEEE Transactions on applied superconductivity, vol. 11, No. 1, Mar. 2001. Section entitled "I. Introduction"; p. 998 section entitled "II. Quantum States and Decoherence in a Resistively Shunted Junction"; p. 998-999 right column, 1st and 2nd paragraph; p. 999 section entitled "V. Designed to Avoid Heating"; p. 1000-1001 figures 1, 2.

Invitation to Pay Additional Fees/Restriction and Partial International Search Report corresponding to Application No. PCT/US2018/045184, dated Oct. 26, 2018.

International Search Report and Written Opinion corresponding to International Application No. PCT/US2018/045184 dated Dec. 17, 2018.

International Search Report and Written Opinion corresponding to International App. No. PCT/US2018/048590 dated Nov. 28, 2018.

\* cited by examiner

SUPERCONDUCTING DEVICE WITH THERMALLY CONDUCTIVE HEAT SINK

GOVERNMENT INTEREST

The invention was made under Government Contract Number 30059305. Therefore, the US Government has rights to the invention as specified in that contract.

TECHNICAL FIELD

The present disclosure relates generally to integrated circuits, and more particularly to a superconducting device with a thermally conductive heat sink.

BACKGROUND

Monolithic Microwave Integrated circuit (MMIC) chips operating at cryogenic temperatures have superconducting circuits that need to be thermally managed by removing the heat from the superconducting circuits down towards the substrate. Heat removal off the top side is inefficient due to superconducting solder bumps. This leads to unacceptably high temperature gradients. However, ground planes made of superconducting mesh material in lower level layers in the MMIC bring the entire layers to a thermal equilibrium. Because of this, portions of devices on the MMIC that need to be maintained at lower temperatures end up becoming exposed to higher temperature components. At the cryogenic conditions, heat load, cooling resources, and temperature are strongly tied to each other. The savings of one unit of power dissipation is magnified by multiple orders of magnitude when lifting from cryogenic temperatures to room temperature.

A typical superconducting electronic circuit will contain resistors made from a metal with a low electrical conductivity and superconducting elements that are fabricated in or on an insulating material. In typical operation, currents flowing through the resistors will generate heat in the form of hot electrons. The heat will be trapped in the electrons until it can convert to phonons via the electron-phonon coupling. The hot phonons will then travel through the circuit to the package and ultimately to the cryocooler. During their migration to the cryocooler, they heat the entire electronic circuit resulting in an increase in energy to maintain the electronic circuit at a desired operating temperature.

SUMMARY

In one example, an integrated circuit is provided that comprises a resistor, a first superconducting structure coupled to a first end of the resistor, and a second superconducting structure coupled to a second end of the resistor. A thermally conductive heat sink structure is coupled to the second end of the resistor for removing heat from the electrons prior to generating hot phonons.

In another example, a monolithic microwave integrated circuit (MMIC) is provided. The MMIC comprises a dielectric structure overlying a substrate, a plurality of superconducting structures residing in a first dielectric layer of the dielectric structure, a plurality of resistors residing in a second dielectric layer of the dielectric structure, and a plurality of superconducting contacts residing in an intermediate layer of the dielectric structure. The intermediate layer resides between the first dielectric layer and the second dielectric layer. A first superconducting contact of the plurality of superconducting contacts couples a first end of a given resistor to a first superconducting structure, and a second superconducting contact of the plurality of superconducting contacts couples a second end of the given resistor to a second superconducting structure for each of the plurality of resistors. The MMIC further comprises a thermally conductive heat sink structure coupled to second ends of each of the plurality of resistors to form a common ground and to remove heat from the electrons of the plurality of resistors prior to the hot electrons generating phonons.

DETAILED DESCRIPTION

Figure 1:
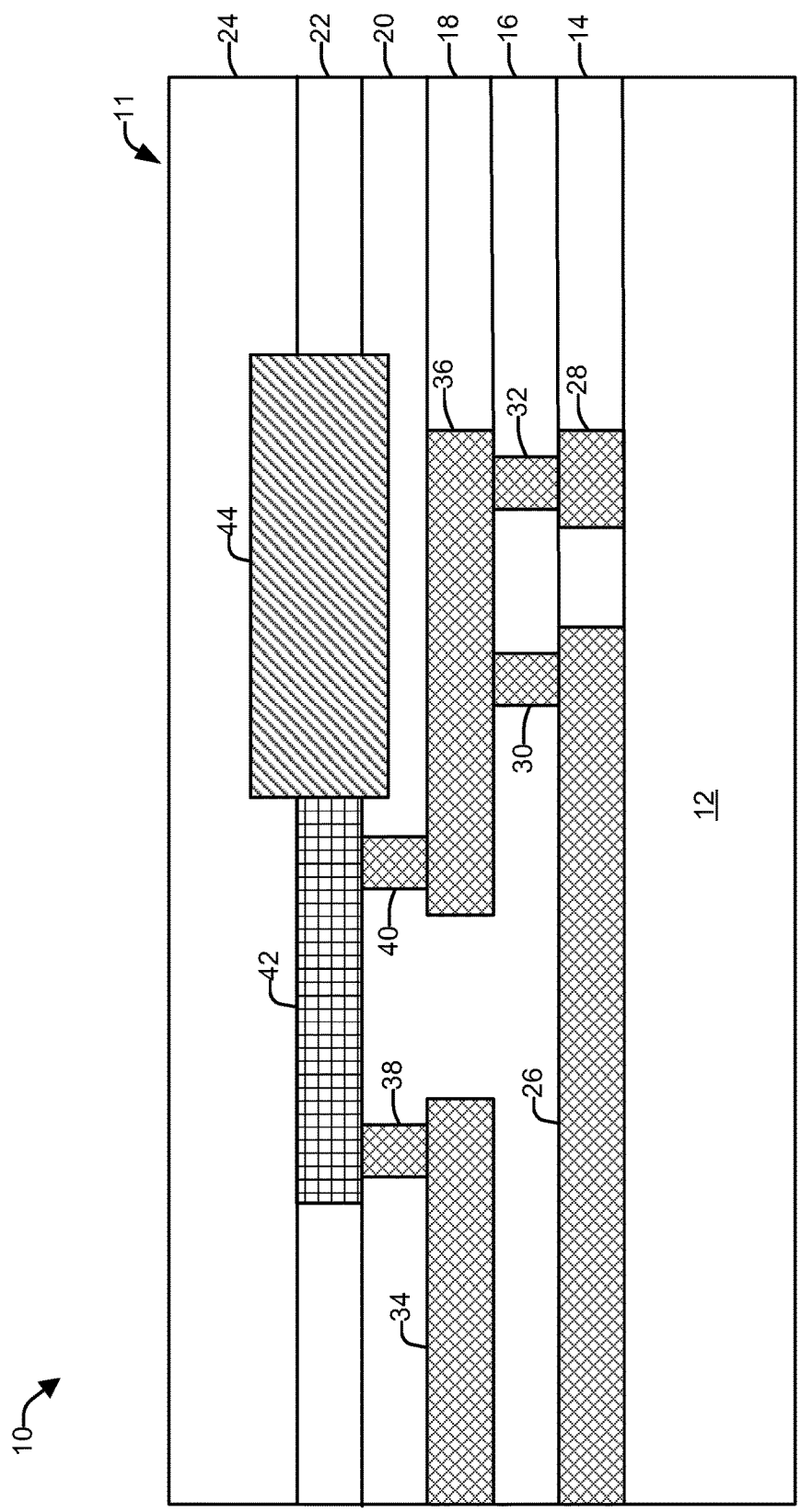
FIG. 1 illustrates cross-sectional view of a portion of an example integrated circuit.

The present disclosure describes an integrated circuit (e.g., Monolithic Microwave Integrated circuit (MMIC)) that includes superconducting circuits disposed in a dielectric structure, and a thermally conductive heat sink that provides a thermal path to remove heat from components of the integrated circuit. The highly thermally conductive heat sink can be formed of a normal metal that has a high thermal conductivity, such as copper. The normal metal need not be copper but can be other highly thermally conductive metals that do not become a superconductor under cryogenic temperatures. Additional examples include gold, silver, tungsten, molybdenum, iridium, and rhodium.

A normal metal as defined herein refers to a metal that is a very good thermal conductor, such as a highly thermal conductive metal that readily transports and distributes heat via electron conduction to provide a mechanism to remove heat from active circuits. Active circuits can include heat generating circuit components, such as resistors or other components that generate heat as a result of current flowing through the circuit components. The resistors can be formed of a resistive material such as a titanium tungsten alloy or molybdenum. The active circuits can also include superconducting components that form part of the active circuits. Superconducting components include superconductive material, which is a very good electrically conductive material but a poor thermal conductive material. However, the superconducting components need to be maintained at defined cryogenic temperatures, which requires energy. Heat generated by the heat generating components causes the temperature of the device to increase that includes the heat generating components and the superconducting components, and as a result requires more energy to maintain the device and its associated components at the defined cryogenic temperatures.

In one example, a control circuit for an active component of a superconducting device contains a pair of energized superconducting structures (e.g., transmission lines, Josephson junctions, inductors, quantum bits, or a combination thereof such as one or more reciprocal quantum logic devices) with flowing electrical current. The system needs to be kept below the maximum operating temperature, such as 50 millikelvin (mK). One benefit of being below the operating temperature is that the control circuits behave as superconductors. The current flowing through them has no resistance, and therefore no heat is dissipated. To complete the electrical circuit, a resistive element is sometimes placed between the two energized superconducting structures. Since this element needs to have electrical resistive properties for the control circuit to operate properly, the element is not a superconductor. Current flowing through this element dissipates heat. It is this heat that needs to be thermally managed.

The highly thermally conductive heat sink removes heat from the electrons of the resistive elements prior to the hot electrons creating phonons to reduce heat in the MMIC. In one example, the normal metal thermal sink is coupled to ends of the resistive elements, and can provide a common ground. The advantages of a common ground are a well-managed heat flow and a concentration of heat paths to a common sink that also operates as a common electrical ground. Alternatively, an electrical ground could be provided by a second common ground made of a superconducting material. A thermally conductive contact can couple the thermally conductive heat sink to a thermally conductive plate disposed on top of the dielectric structure. Alternatively, a thermally conductive contact can directly couple an end of a respective resistor for each of a plurality of resistors and respective thermally conductive contacts to a thermally conductive plate. The normal metal conductive plate provides an augmented heat conduction path, and can be cooled directly. In one example, a through substrate via (TSV) couples the thermally conductive plate to a thermally conductive heat spreader disposed on a bottom of the substrate. The TSV provides a thermal path through the dielectric structure and the substrate without introducing significant temperature gradients. This heat spreader increases the heat transfer area between the bottom of the chip and a coldhead that provides the cryogenic temperatures to the MMIC. The increased area reduces temperature gradients between the spreader and the coldhead.

FIG. 1 illustrates cross-sectional view of a portion of an example integrated circuit 10. The portion of the integrated circuit 10 includes a plurality of stacked dielectric layers overlying a substrate 12. The plurality of dielectric layers form a dielectric structure 11. The dielectric structure 11 includes a first dielectric layer 14 overlying the substrate 12, a second dielectric layer 16 overlying the first dielectric layer 14, a third dielectric layer 18 overlying the second dielectric layer 16, a fourth dielectric layer 20 overlying the third dielectric layer 18, a fifth dielectric layer 22 overlying the fourth dielectric layer 20, and a sixth dielectric layer 24 overlying the fifth dielectric layer 22. The substrate 12 can be formed of silicon, glass or other substrate material. A plurality of superconducting structures are disposed in the dielectric structure 11.

A first superconducting structure 26 and a second superconducting structure 28 reside in the first dielectric layer 14. A third superconducting structure 34 and a fourth superconducting structure 36 reside in the third dielectric layer 16. A first superconducting contact 30 connects the first superconducting structure 26 to the fourth superconducting structure 36 through the second dielectric layer 16, and a second superconducting contact 32 connects the second superconducting structure 28 to the fourth superconducting structure 36 through the second dielectric layer 16. A resistor 42 resides in the fifth dielectric layer 22 and is coupled at a first end to the third superconducting structure 34 by a third superconducting contact 38 and is coupled at a second end to the fourth superconducting structure 36 by a fourth superconducting contact 40. Both the third superconducting contact 38 and the fourth superconducting contact 40 extend through the fourth dielectric layer 20. A second end of the resistor 42 is also coupled to a thermally conductive sink structure 44. The thermally conductive sink structure 44 can act as a ground plane for the resistor 42 and superconducting structures.

The thermally conductive sink structure 44 is formed of a thermally conductive material, such as a normal metal. A thermally conductive material is a material that is a relatively good thermal conductor, such that it readily transfers heat. A superconductive material is a good electrically conductive material but a poor thermal conductive material. Therefore, the thermally conductive sink structure 44 is not formed of a superconductive material, but a material that is relatively good at conducting heat from the resistor 42 to the thermally conductive sink structure 44. The thermally conductive sink structure 44 can be cooled by an external source.

The thermally conductive sink structure 44 can be connected to the chip package and/or the cryocooler via a path made from normal metal with very high conductivity. Hot electrons generated in the resistor 42 can be carried through the normal metal to the cryocooler providing an alternate path for heat flow, for example, to the top or bottom of the integrated circuit. As long as the normal metal has a sufficiently high thermal conductivity, the thermal resistance of this second path will be less than the phonon mediated path and the temperature of the circuit will be reduced.

Figure 2:
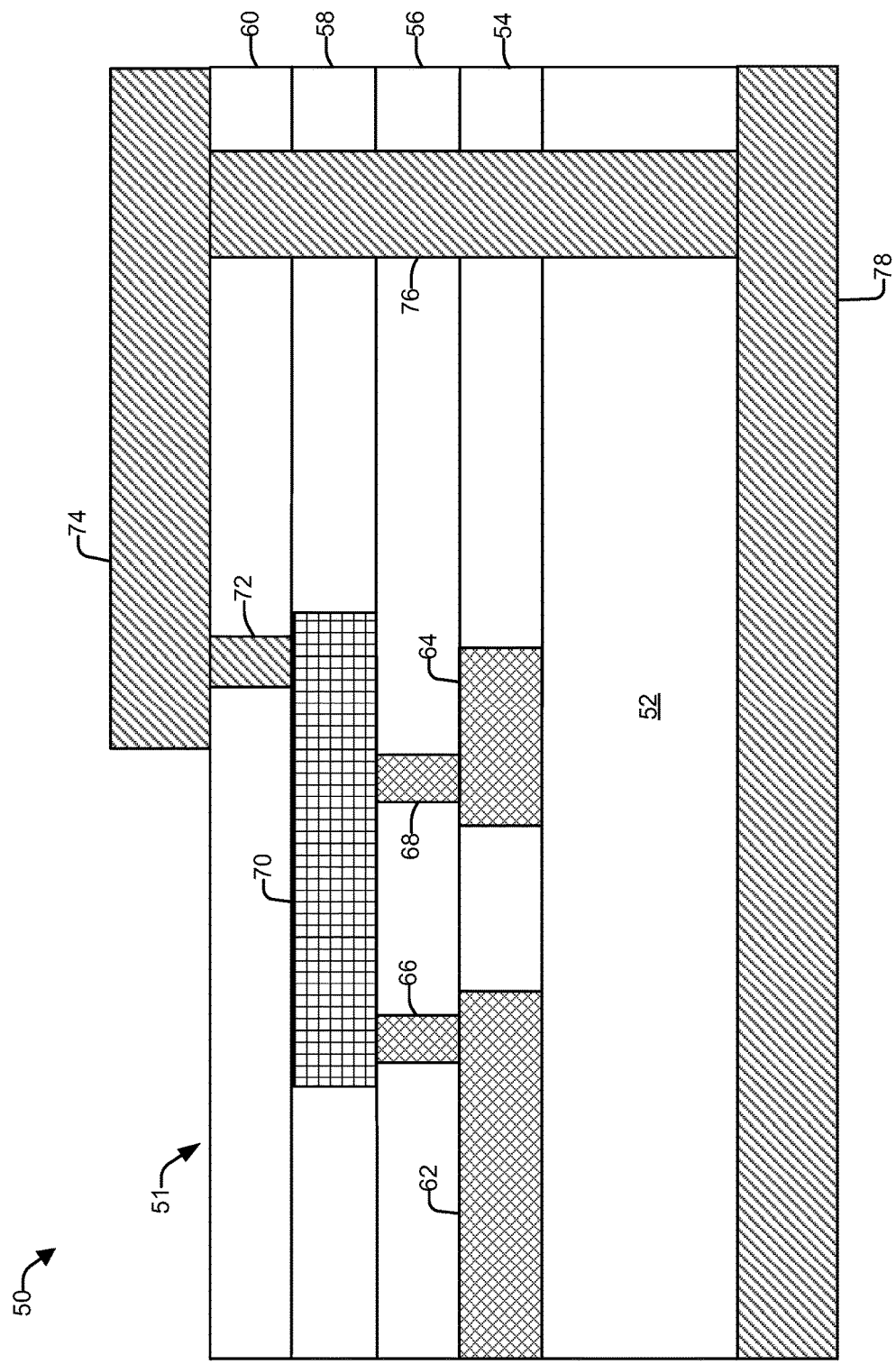
FIG. 2 illustrates cross-sectional view of a portion of another example integrated circuit.
Figure 3:
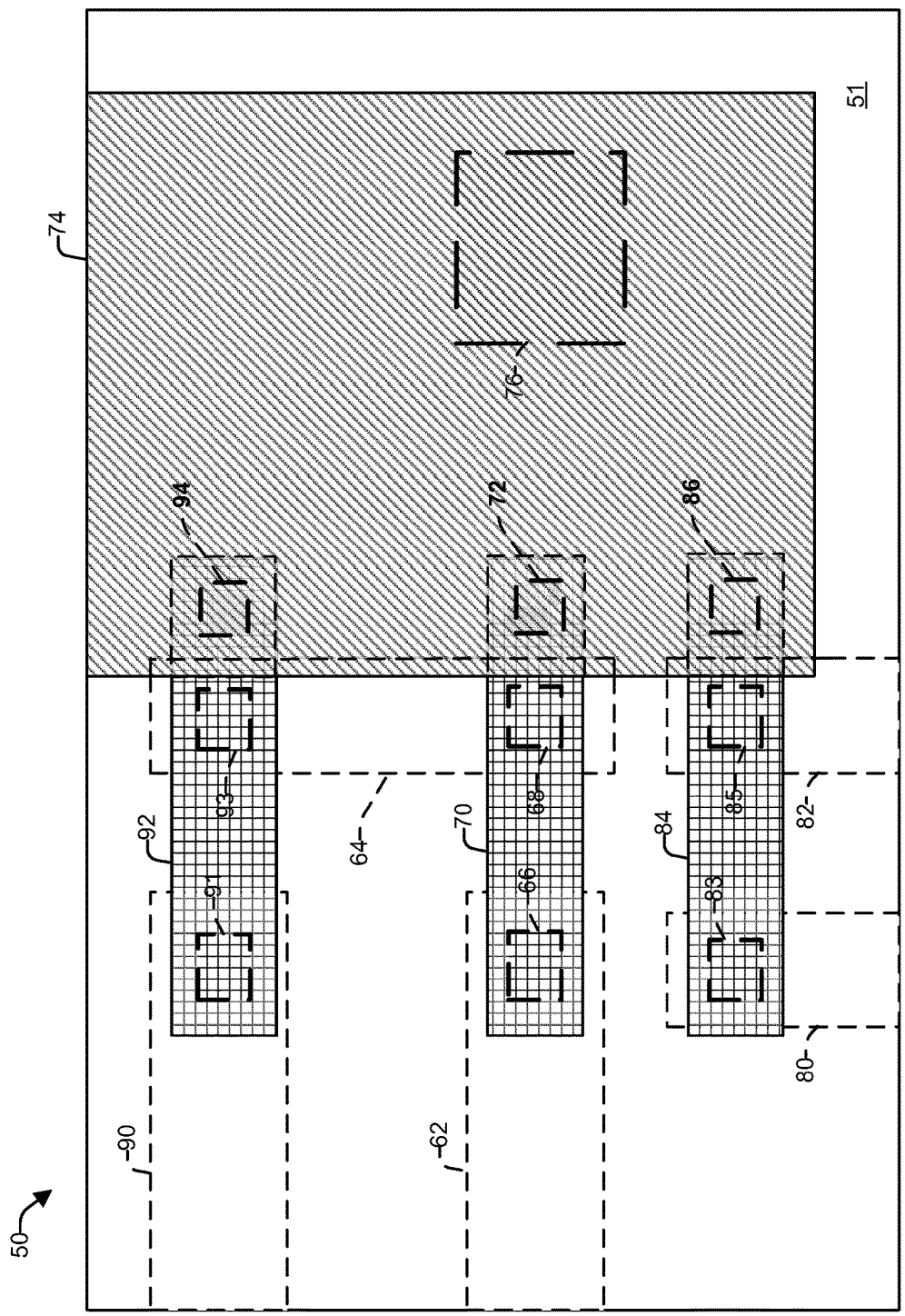
FIG. 3 illustrates a plan view of the portion of the integrated circuit of FIG. 2.

In another example as illustrated in FIGS. 2-3, the resistor is extended beyond the electrical connection to the superconducting circuit. A via is then etched through the insulator from the resistor to the surface of the circuit and filled with a high thermally conductive metal such as gold or copper. The top and bottom surfaces of the chip are covered in high thermally conductive normal metal and a through substrate via (TSV) contact etched through the chip and filled with high thermally conductive normal metal to couple the top and bottom high thermally conductive metal layers. The bottom of the chip can be held in contact with a normal metal package.

FIG. 2 illustrates a cross-sectional view of portion of an example integrated circuit 50 with the TSV contact discussed above. FIG. 3 illustrates a plan view of the portion of the integrated circuit 50 of FIG. 2. The portion of the integrated circuit 50 includes a plurality of stacked dielectric layers overlying a substrate 52. The plurality of dielectric layers form a dielectric structure 51. The dielectric structure 51 includes a first dielectric layer 54 overlying the substrate 52, a second dielectric layer 56 overlying the first dielectric layer 54, a third dielectric layer 58 overlying the second dielectric layer 56, and a fourth dielectric layer 60 overlying the third dielectric layer 58 The substrate 52 can be formed of silicon, glass or other substrate material.

A plurality of superconducting structures 62, 64, 80, 82 and 90 are disposed in the first dielectric layer 54, and a plurality of resistors 70, 84 and 92 are disposed in the third dielectric layer 58. Ends of each resistor of the plurality of resistors 70, 84 and 92 are coupled to respective superconducting structures by superconducting contacts 66, 68, 83, 85, 91 and 93 that extend through the second dielectric layer 56 to form a plurality of active circuits. A resistor and a pair of superconducting structures can form an active circuit. A ground end of each resistor extends beyond its contact point to its respective superconducting structure. Respective thermally conductive contacts 72, 86 and 94 couple each ground end of each respective resistor, for each of the plurality of resistors 70, 84 and 92, to a thermally conductive plate 74 that resides on a top surface of the integrated circuit 50. The thermally conductive plate 74 provides an augmented heat conduction path, and can be cooled directly.

A through substrate via (TSV) 76 couples the thermally conductive plate 74 to a thermally conductive heat spreader 78 disposed on a bottom of the substrate 50. The TSV 76 provides a thermal path through the dielectric structure 51 and the substrate 52 without introducing significant temperature gradients. This thermally conductive heat spreader 78 increases the heat transfer area between the bottom of the chip and a coldhead that provides the cryogenic temperatures to the IC. The increased area reduces temperature gradients between the thermally conductive heat spreader 78 and the coldhead.

Figure 4:
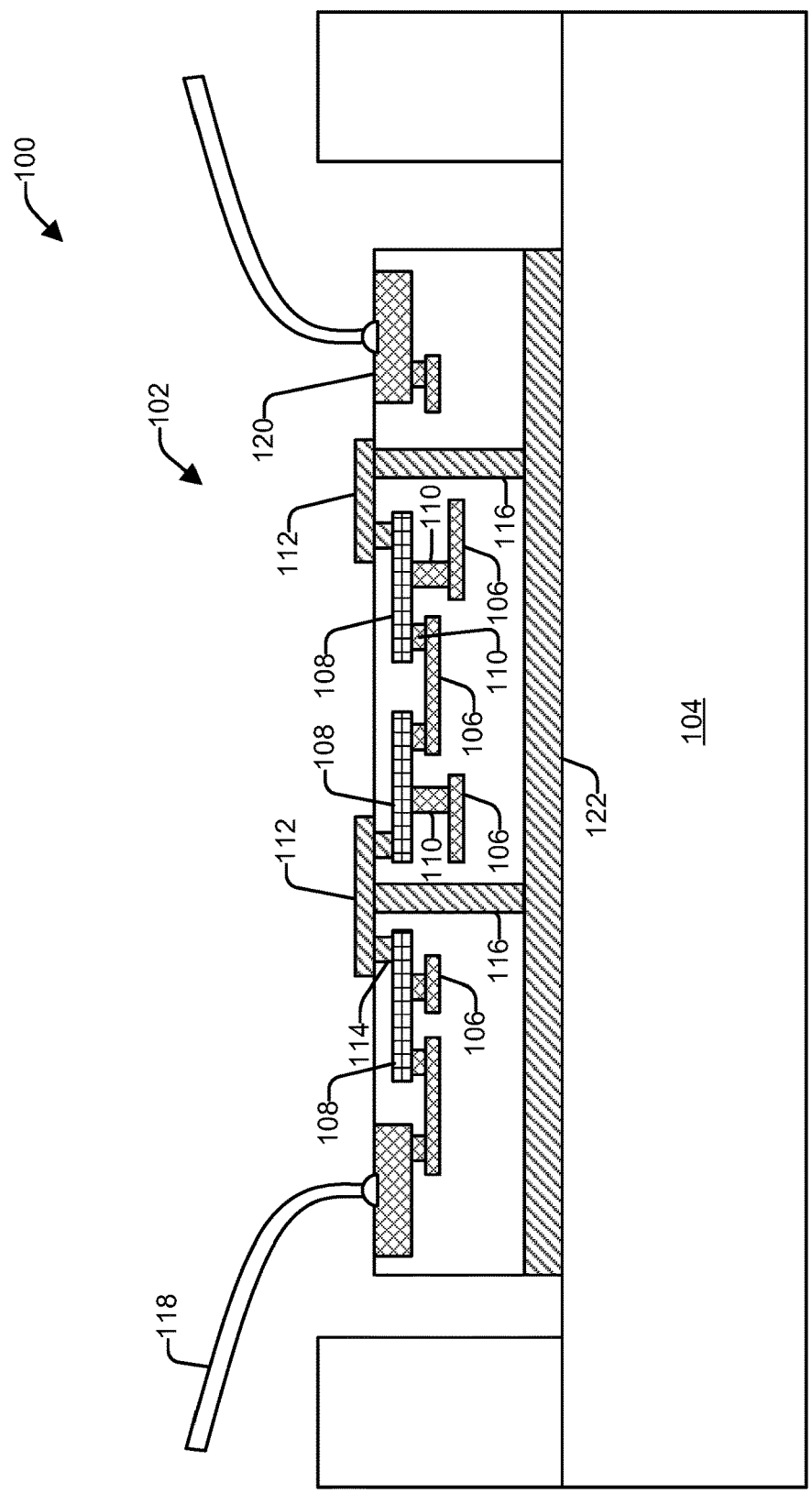
FIG. 4 illustrates a cross-sectional view of an example of a Monolithic Microwave Integrated circuit (MMIC).

As illustrated in FIG. 4, a MMIC 100 includes an integrated circuit 102 that includes active devices with superconducting structures 106 and resistors 108 connected to one another by superconducting contacts 110. A plurality of thermally conductive plates 112 reside on the top surface of the integrated circuit 102 and connect to resistors 108 through respective thermally conductive contacts 114 and to the backside of the integrated circuit 102 through respective thermally conductive through substrate vias (TSVs) (116). The integrated circuit 102 can be disposed in a package 104 such as a carrier, printed circuit board or interposer. The backside of the substrate of the integrated circuit 102 is coated with a normal metal to form a thermally conductive spreader 122 that connects to the package 104. This provides a highly conductive thermal path from the resistors 108 to the package 104 to allow heat to escape. In this instance, electrical contact is made to the superconducting structures 106 through a wirebond 118 to a superconducting contact pad 120. Alternatively, the superconducting contact pad 120 can be connected to a printed circuit board via a pressure contact or an interposer or soldered directly to a socket.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An integrated circuit comprising:
a resistor;
a first superconducting structure coupled to a first end of the resistor;
a second superconducting structure coupled to a second end of the resistor; and
a thermally conductive heat sink structure coupled to the second end of the resistor for removing heat from electrons of the resistor prior to the electrons creating phonons;
wherein the thermally conductive heat sink structure is formed of a normal metal that is not superconducting.

2. The circuit of claim 1, wherein the thermally conductive heat sink structure is encapsulated in a dielectric structure along with the resistor, and the first and second superconducting structures.

3. The circuit of claim 1, wherein the thermally conductive heat sink structure is a thermally conductive sink plate coupled to the resistor by a thermally conductive contact that extends through a portion of a dielectric structure that encapsulates the resistor and the first and second superconducting structures, the thermally conductive heat sink plate being disposed on one of above the top surface and below the bottom surface of the dielectric structure.

4. The circuit of claim 3, wherein the thermally conductive heat sink plate is disposed on the top surface of the dielectric structure, and further comprising a thermally conductive heat spreader disposed below the bottom surface of the dielectric structure, and a thermally conductive through substrate via (TSV) that couples the thermally conductive heat sink plate to the thermally conductive heat spreader, the thermally conductive heat spreader being configured to be disposed adjacent a cryo-cooler.

5. The circuit of claim 1, wherein the first and second superconducting structures are disposed in a first dielectric layer, the resistor is disposed in a second dielectric layer, and the first and second superconducting structures are coupled to respective ends of the resistor by superconducting contacts that extend through an intermediate dielectric layer residing in between the first dielectric layer and the second dielectric layer, the first dielectric layer, the intermediate layer and the second dielectric layer forming a dielectric structure.

6. The circuit of claim 1, further comprising a plurality of additional resistors with each resistor being coupled between respective superconducting structures, each of the plurality of resistors and the resistor being coupled on a second end to the thermally conductive heat sink structure which forms a common ground.

7. The circuit of claim 6, wherein the superconducting structures are disposed in a first dielectric layer, the resistor and the plurality of additional resistors are disposed in a second dielectric layer, and the respective superconducting structures are coupled to respective ends of the resistor to form a plurality of active circuits by superconducting contacts that extend through an intermediate dielectric layer residing in between the first dielectric layer and the second dielectric layer.

8. The circuit of claim 7, wherein the thermally conductive heat sink structure is a thermally conductive heat sink plate that is coupled to second ends of each of the plurality of additional resistors by thermally conductive contacts that extends through a portion of a dielectric structure, the thermally conductive heat sink plate being disposed on one of the top surface and bottom surface of the dielectric structure.

9. The circuit of claim 8, wherein the thermally conductive heat sink plate is disposed on the top surface of the dielectric structure, and further comprising a thermally conductive heat spreader disposed on a bottom surface of the dielectric structure, and a thermally conductive through substrate via (TSV) that couples the thermally conductive heat sink plate to the thermally conductive heat spreader, the thermally conductive heat spreader being configured to be disposed adjacent a cryo-cooler.

10. The circuit of claim 9, further comprising a plurality of additional thermally conductive heat plates disposed on the top surface of the dielectric structure, and each coupled to the thermally conductive heat spreader by respective thermally conductive through substrate vias (TSVs) that couples the respective thermally conductive heat sink plate to the thermally conductive heat spreader.

11. The circuit of claim 1, wherein the thermally conductive sink structure is formed of copper, gold, silver, tungsten, molybdenum, iridium, and/or rhodium.

12. A monolithic microwave integrated circuit (MMIC) comprising a carrier and the integrated circuit of claim 1 residing on the carrier.

13. A monolithic microwave integrated circuit (MMIC) comprising:
- a dielectric structure overlying a substrate;
- a plurality of superconducting structures residing in a first dielectric layer of the dielectric structure;
- a plurality of resistors residing in a second dielectric layer of the dielectric structure;
- a plurality of superconducting contacts residing in an intermediate layer of the dielectric structure, the intermediate layer residing between the first dielectric layer and the second dielectric layer, a first superconducting contact of the plurality of superconducting contacts coupling a first end of a given resistor to a first superconducting structure, and a second superconducting contact of the plurality of superconducting contacts coupling a second end of the given resistor to a second superconducting structure for each of the plurality of resistors; and
- a thermally conductive heat sink structure coupled to second ends of each of the plurality of resistors to form a common ground and to move electrons from the plurality of resistors prior to the electrons being converted to phonons;
- wherein the thermally conductive heat sink structure is formed of a normal metal that is not superconducting.

14. The MMIC of claim 13, wherein the thermally conductive heat sink structure is encapsulated in a dielectric structure.

15. The MMIC of claim 13, wherein the thermally conductive heat sink structure is a thermally conductive heat sink plate that is coupled to second ends of each of the plurality of additional resistors by thermally conductive contacts that extends through a portion of a dielectric structure, the thermally conductive heat sink plate being disposed on one of the top surface and bottom surface of the dielectric structure.

16. The MMIC of claim 15, wherein the thermally conductive heat sink plate is disposed on the top surface of the dielectric structure, and further comprising a thermally conductive heat spreader disposed on a bottom surface of the dielectric structure, and a thermally conductive through substrate via (TSV) that couples the thermally conductive heat sink plate to the thermally conductive heat spreader, the thermally conductive heat spreader being configured to be disposed adjacent a cryo-cooler.

17. The MMIC of claim 16, further comprising a plurality of additional thermally conductive heat plates disposed on the top surface of the dielectric structure, and each coupled to the thermally conductive heat spreader by respective thermally conductive through substrate vias (TSVs) that couples the respective thermally conductive heat sink plate to the thermally conductive heat spreader.

18. The MMIC of claim 13, wherein the thermally conductive sink structure is formed of copper, gold, silver, tungsten, molybdenum, iridium, and/or rhodium.

19. The MMIC of claim 13, wherein the dielectric structure and the substrate reside in a carrier.

* * * * *